United States Patent
Scheuerlein (10) Patent No.: US 8,014,185 B2
(45) Date of Patent: Sep. 6, 2011

(54) MULTIPLE SERIES PASSIVE ELEMENT MATRIX CELL FOR THREE-DIMENSIONAL ARRAYS

(75) Inventor: Roy E. Scheuerlein, Cupertino, CA (US)

(73) Assignee: SanDisk 3D LLC, Milpitas, CA (US)

(*) Notice: Subject to any disclaimer, the term of this patent is extended or adjusted under 35 U.S.C. 154(b) by 670 days.

(21) Appl. No.: 12/216,677

(22) Filed: Jul. 9, 2008

(65) Prior Publication Data
US 2010/0008123 A1 Jan. 14, 2010

(51) Int. Cl.
*G11C 17/00* (2006.01)
(52) U.S. Cl. .......... 365/100; 365/148; 365/163
(58) Field of Classification Search .......... 365/100, 365/148, 163; 257/2, 52
See application file for complete search history.

(56) References Cited

U.S. PATENT DOCUMENTS

| | | |
|---|---|---|
| 3,569,945 A | 3/1971 | Ho |
| 3,693,173 A | 9/1972 | Heightley et al. |
| 4,646,266 A | 2/1987 | Ovshinsky et al. |
| 5,751,012 A | 5/1998 | Wolstenholme et al. |
| 5,835,396 A | 11/1998 | Zhang |
| 5,915,167 A | 6/1999 | Leedy |
| 6,034,882 A | 3/2000 | Johnson et al. |
| 6,055,180 A | 4/2000 | Gudesen et al. |
| 6,185,122 B1 | 2/2001 | Johnson et al. |
| 6,420,215 B1 | 7/2002 | Knall et al. |
| 6,579,760 B1 | 6/2003 | Lung |
| 6,618,295 B2 | 9/2003 | Scheuerlein |
| 6,753,561 B1 | 6/2004 | Rinerson et al. |
| 6,879,508 B2 * | 4/2005 | Tran ................ 365/100 |
| 6,912,153 B2 | 6/2005 | Tihanyi |
| 7,035,141 B1 | 4/2006 | Tripsas et al. |
| 7,038,935 B2 * | 5/2006 | Rinerson et al. ........ 365/148 |
| 7,106,652 B2 | 9/2006 | Scheuerlein |
| 7,283,383 B2 | 10/2007 | Kang |
| 2004/0160819 A1 | 8/2004 | Rinerson et al. |
| 2005/0180203 A1 | 8/2005 | Lin et al. |
| 2005/0269553 A1 | 12/2005 | Sen et al. |
| 2006/0002173 A1 | 1/2006 | Parkinson et al. |
| 2006/0006463 A1 | 1/2006 | Islam et al. |
| 2008/0144354 A1 * | 6/2008 | Choi et al. ............ 365/148 |
| 2008/0175032 A1 | 7/2008 | Tanaka et al. |
| 2009/0067229 A1 | 3/2009 | Kang et al. |
| 2009/0180309 A1 | 7/2009 | Liu |
| 2010/0008123 A1 | 1/2010 | Scheuerlein |

FOREIGN PATENT DOCUMENTS
EP 1 426 966 A2 9/2004
(Continued)

OTHER PUBLICATIONS

U.S. Appl. No. 09/560,626, filed Apr. 28, 2000, Knall.

(Continued)

*Primary Examiner* — Son Dinh
(74) *Attorney, Agent, or Firm* — The Marbury Law Group, PLLC (57) ABSTRACT

A nonvolatile memory cell including at least two two-terminal non-linear steering elements arranged in series, and a resistivity switching storage element arranged in series with the at least two two-terminal non-linear steering elements. A memory array, comprising a plurality of the nonvolatile memory cells is also described. A method of forming a nonvolatile memory cell is also described.

28 Claims, 8 Drawing Sheets

FOREIGN PATENT DOCUMENTS

| | | |
|---|---|---|
| EP | 1 659 593 A2 | 5/2006 |
| EP | 1 892 722 A1 | 2/2008 |
| WO | WO 03/085675 A2 | 10/2003 |
| WO | WO 2008/062688 A1 | 5/2008 |
| WO | WO 2008/140979 A1 | 11/2008 |
| WO | WO 2008/157049 A1 | 12/2008 |

OTHER PUBLICATIONS

U.S. Appl. No. 09/638,428, filed Aug. 14, 2000, Johnson.
U.S. Appl. No. 09/897,705, filed Jun. 29, 2001, Kleveland.
U.S. Appl. No. 10/185,508, filed Jun. 27, 2002, Cleeves.
U.S. Appl. No. 11/287,452, filed Nov. 23, 2005, Herner.
U.S. Appl. No. 12/216,678, filed Jul. 9, 2008, Scheuerlein et al.

Peter K. Naji et al., "A 256kb 3.0V 1T1MTJ Nonvolatile Magnetoresistive RAM", Digest of Technical Papers of the 2001 IEEE International Solid-State Circuits Conference, ISSCC 2001/ Session 7/Technology Directions: Advanced Technologies/7.6, Feb. 6, 2001, 3 pgs.
International Search Report and Written Opinion mailed Aug. 21, 2009 in International application No. PCT/US2009/049513.
International Search Report and Written Opinion mailed Aug. 28, 2009 in International application No. PCT/US2009/049502.
International Search Report mailed Mar. 19, 2010 in international application No. PCT/US2009/068234.
Notice of Allowance dated Mar. 1, 2010 received in U.S. Appl. No. 12/216,678.
International Bureau of WIPO. International Preliminary Report on Patentability, Intl. Application PCT/US09/49513. Jan. 11, 2011.

\* cited by examiner

MULTIPLE SERIES PASSIVE ELEMENT MATRIX CELL FOR THREE-DIMENSIONAL ARRAYS

BACKGROUND OF THE INVENTION

The invention relates to a memory cell and a nonvolatile memory array incorporating such a cell.

Nonvolatile memory arrays maintain their data even when power to the device is turned off. In one-time-programmable (OTP) arrays, each memory cell is formed in an initial unprogrammed state, and can be converted to a programmed state by an appropriate electrical pulse. This change is permanent, and such cells are not erasable. In other types of memories, the memory cells are erasable, and can be rewritten many times.

Figure 1:
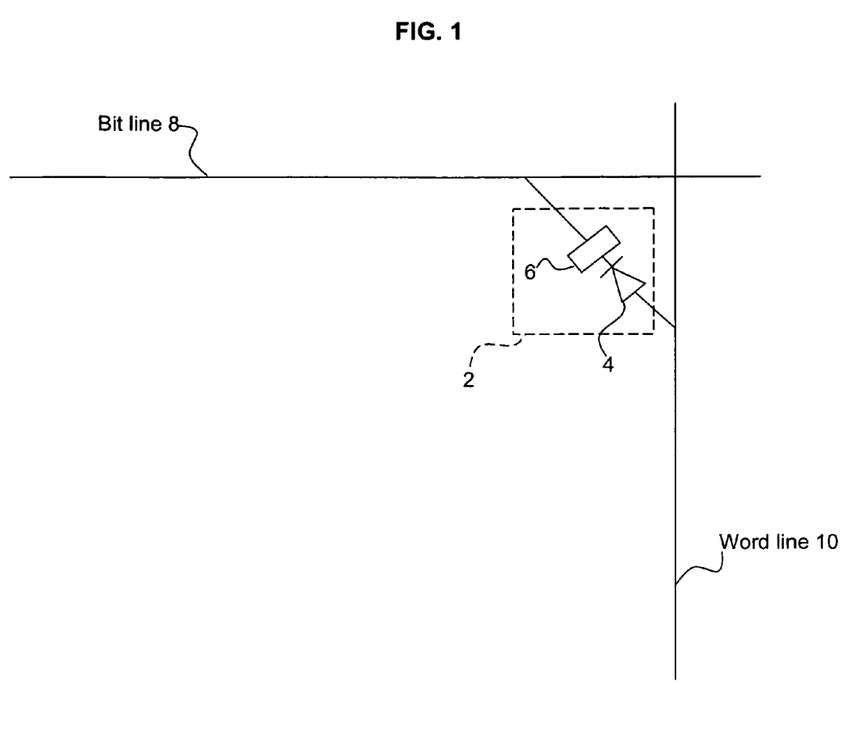
FIG. 1 is a schematic of a conventional memory unit cell with a storage element and a steering element.

FIG. 1 illustrates a conventional memory cell. As shown in FIG. 1, a memory unit cell 2 is composed of a steering element 4, such as a diode, and a storage element 6 connected in series between a bit line 8 and a word line 10. Memory arrays in general, such as two-dimensional or three-dimensional arrays, may comprise many such memory cells arranged within the array.

SUMMARY OF THE PREFERRED EMBODIMENTS

One embodiment of the invention provides a nonvolatile memory cell comprising at least two two-terminal non-linear steering elements arranged in series; and a resistivity switching storage element arranged in series with the at least two two-terminal non-linear steering elements.

The memory cell may be incorporated as part of a memory array, where the memory array comprises: a plurality of nonvolatile memory cells; a plurality of word lines; and a plurality of bit lines.

The plurality of nonvolatile memory cells, word lines and bit lines of the memory array may be arranged to comprise a three dimensional memory array.

Each nonvolatile memory cell of the memory array may comprise: a first terminal connected to one of the plurality of bit lines; a second terminal connected to one of the plurality of word lines; where the resistivity switching storage element and the at least two two-terminal non-linear steering elements are arranged in series between the first terminal and the second terminal. In general, the at least two two-terminal non-linear steering elements and the resistivity switching storage element may be arranged vertically between a lower electrode and an upper electrode, where the lower and upper electrodes comprise portions of the word and bit lines.

Each of the at least two two-terminal non-linear switching elements of the array may comprise a diode. Each diode may comprise a semiconductor p-n diode or a semiconductor p-i-n diode. Each diode may alternatively comprise a metal-insulator-metal (MIM) diode or a metal-insulator-insulator-metal (MIIM) diode.

The resistivity switching storage element of the memory cell may be selected from at least one of an antifuse, fuse, polysilicon memory effect element, metal oxide or switchable complex metal oxide element, carbon based element, phase change material element, conductive bridge element, or switchable polymer element. The carbon based element may be selected from carbon nanotube, amorphous carbon, microcrystalline carbon, graphite or graphene resistivity switching material. The resistivity switching storage element may have a thickness in a range of about 2 to about 2000 Å.

The at least two non-linear steering elements may comprise two non-linear steering elements. The resistivity switching storage element may be arranged between the two non-linear steering elements. Alternatively, the resistivity switching storage element may be arranged on one side of both of the two non-linear steering elements.

Alternatively, the at least two non-linear steering elements may comprise four non-linear steering elements arranged in series. The four non-linear steering elements may comprise a first pair of non-linear steering elements and a second pair of non-linear steering elements; and the resistivity switching storage element may be arranged between the first pair and the second pair of non-linear steering elements. Alternatively, the resistivity switching storage element may be arranged on one side of the four non-linear steering elements. The four non-linear steering elements may comprise a first pair of non-linear steering elements and a second pair of non-linear steering elements; where a first conductor element is arranged between the non-linear steering elements of the first pair; and a second conductor element is arranged between the non-linear steering elements of the second pair.

Another embodiment of the invention provides a method of forming a memory cell. The method comprises: forming a lower electrode; forming at least two two-terminal non-linear steering elements arranged in series and a resistivity switching storage element over the lower electrode; and forming an upper electrode over the at least two two-terminal non-linear steering elements and the resistivity switching storage element.

In the method, each of the at least two non-linear switching elements may comprise a diode.

In the method, each diode may be formed at a temperature below about 600° C.

In the method, each diode comprises a MIM diode, a MIIM diode or a semiconductor diode; and the resistivity switching storage element may be selected from at least one of an antifuse, fuse, polysilicon memory effect element, metal oxide or switchable complex metal oxide element, carbon based element, phase change material element, conductive bridge element, or switchable polymer element.

The preferred aspects and embodiments will now be described with reference to the attached drawings.

DETAILED DESCRIPTION OF THE PREFERRED EMBODIMENTS

Figure 2A:
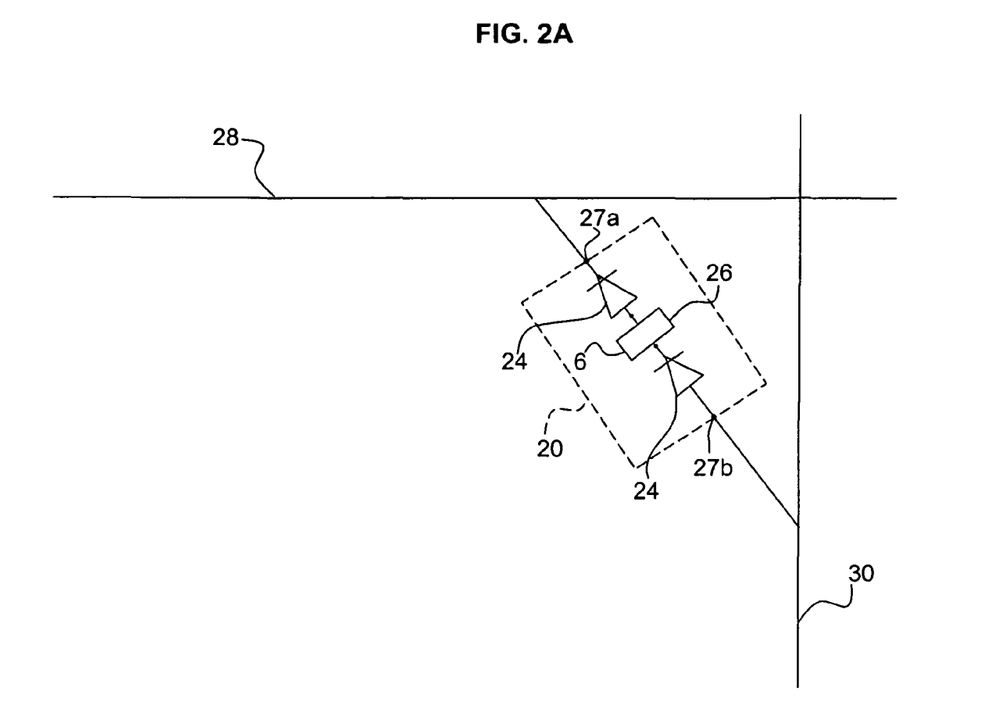
FIGS. 2A and 2B are schematics of memory unit cells according to embodiments of the invention.
Figure 2B:
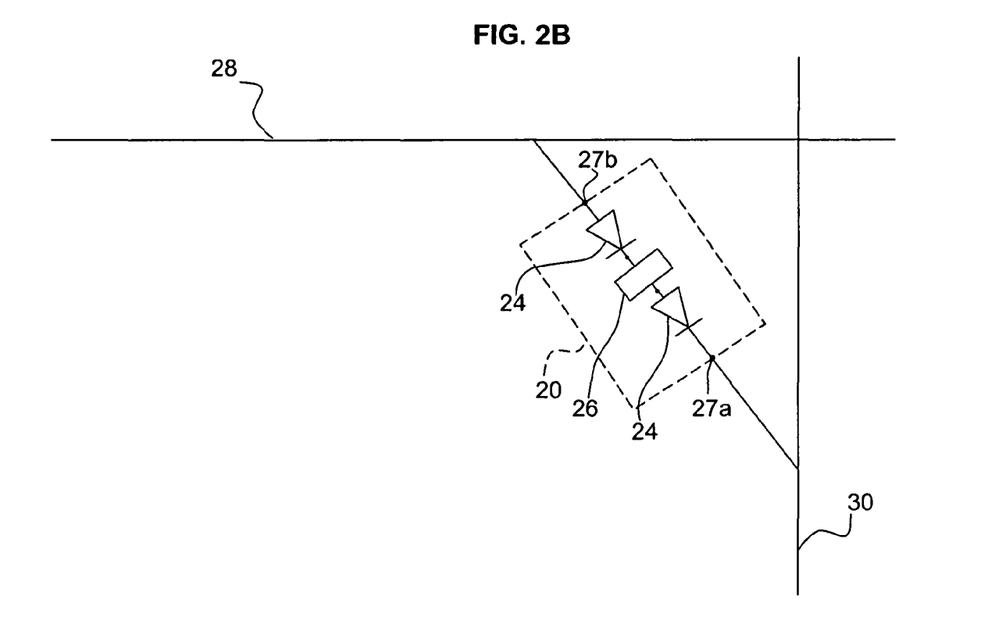

FIGS. 2A and 2B illustrate a memory unit cell according to embodiments of the invention, where the cell in FIG. 2A has the opposite polarity to that in FIG. 2B. The memory cell 20 shown in FIG. 2A or 2B is connected to bit line 28 and word line 30 via a first terminal 27a and second terminal 27b of the memory cell 20. In the arrangement shown in FIG. 2A, the first terminal 27a connects to the bit line 28, while the second terminal 27b connects to the word line 30. FIG. 2B illustrates the opposite polarity arrangement where the second terminal 27b connects to the bit line 28, while the first terminal 27a connects to the word line 30.

The memory cell 20 comprises at least two two-terminal non-linear steering elements, steering elements 24, and a resistivity switching storage element 26 arranged in series with the steering elements 24. The resistivity switching storage element 26 comprises a material that changes its resistivity upon being programmed with an appropriate electrical pulse.

Figure 3:
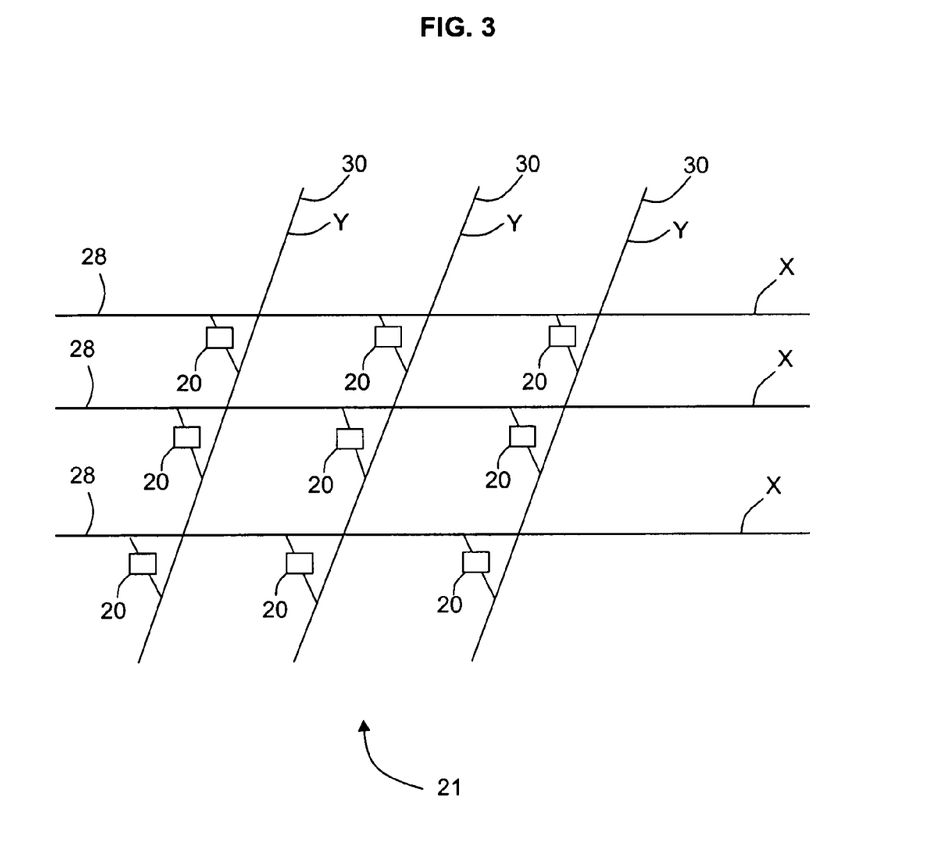
FIG. 3 is a schematic illustrating a number of memory cells arranged in a portion of an array.

FIG. 3 is a schematic illustrating a number of memory cells 20 arranged in an array 21 with bit lines 28 and word lines 30, where the bit lines can be considered to be X lines and the word lines Y lines for the purposes of illustration. The array 21 is shown with only nine cells 20 for the purposes of illustration. In general, the number of cells 20 in the array 21 will be many more than nine. In general, the cell 20 may be any of the cells as shown in FIGS. 2A, 2B, and 4-6, for example. The array may be two-dimensional or three-dimensional in the arrangement of the memory cells 20.

The arrangement of the steering elements 24 of the cell 20 in series with the resistivity switching element 26 reduces the occurrence of block defects. If one of the steering elements 24 of a memory cell has a defect, such as a manufacturing defect, that would tend to cause excessive current leakage from the corresponding X line to the corresponding Y line, then the other steering element of the memory cell 20 still functions to limit the leakage current in many cases. Thus, by employing at least two steering elements 24 in series with the resistivity switching element 26, block defects due to a defect in one of the steering elements can be reduced.

Referring again to FIGS. 2A and 2B, the steering elements may comprise a diode, for example. The diode may be a semiconductor p-n diode or a semiconductor p-i-n diode, where the p, n, and i refer to p-type semiconductor, n-type semiconductor, and intrinsic (undoped) semiconductor, respectively. An undoped region will never be perfectly electrically neutral, and will always have defects or contaminants that cause it to behave as if slightly n-doped or p-doped. The semiconductor material of the diodes can be silicon, germanium or a silicon-germanium alloy, such as germanium rich silicon germanium. Other semiconductor materials, such as silicon carbide, Group III-V materials, such as GaAs, GaN, etc. and Group II-VI materials, such as ZnSe, CdTe, etc., may also be used depending on the desired end use for the device. The semiconductor material may be polycrystalline, amorphous or single crystalline, depending on deposition conditions, subsequent crystallization annealing, etc.

Alternatively, the diodes 24 of a steering element may comprise a metal-insulator-metal (MIM) diode or a metal-insulator-insulator-metal (MIIM) diode. In a MIIM diode, the insulator arranged between the metal comprises two different insulating layers, which may provide an asymmetrical conduction characteristic to the MIIM diode. Preferably, the steering element may be formed at low temperature, such as below about 600° C., for example. The metal portions of the MIM or MIIM diode may comprise any conductors, such as metals, including Ta, W, Co, etc., and metal alloys, such as TiN. The insulator portions of such diode may comprise silicon oxide, aluminum oxide and/or tanatalum oxide layers.

A tunnel diode of the MIM structure has the advantage that it can be deposited at lower temperatures than a silicon based diode. While many MIM and MIIM diodes may have too low a threshold voltage for many memory materials for resistivity switching storage elements, arranging the MIM or MIIM diodes in series increases the voltage that can be applied to a memory material in a cell without excessive leakage in reverse biased cells.

As mentioned above, the resistivity switching storage element 26 comprises a material that changes its resistivity upon being programmed with an appropriate electrical pulse. The resistivity switching storage element 26 may be a one time programmable (OTP) element, or a rewritable element, for example. The resistivity switching storage element 26 may comprise a material such as an antifuse, fuse, polysilicon memory effect element, metal oxide or switchable complex metal oxide element, carbon based element, phase change material element, conductive bridge element, or switchable polymer element, for example.

For example, the resistivity switching storage element 26 may comprise a carbon based element. The carbon based element may be, for example, carbon nanotubes (SWNTs or MWNTs), amorphous carbon, microcrystalline carbon, graphite or graphene. Graphene and graphite are similar materials where both have relatively flat planes of hexagonally arranged carbon atoms where the layer is very regularly formed with very few breaks or no beaks in the regular hexagonal pattern of $sp^2$ bonds. In general, graphene is thought of as comprising a single atomic layer or a few atomic layers of the planes, while graphite is thought of as having many atomic layers. Alternatively, the carbon layers may be imperfect with breaks in the regular hexagon pattern, such that the $sp^2$ bonded groups of carbon atoms are broken up, overlap, etc. Such material may be referred to as microcrystalline carbon because the crystallites tend to be very small. Amorphous carbon has an amorphous structure which is so broken up that the planar structure is not dominating. In general, as the temperature during the carbon layer forming process is raised, the carbon layer transitions from amorphous carbon to microcrystalline carbon as more $sp^2$ bonds form, to graphite with predominant $sp^2$ bonds.

If the resistivity switching storage element 26 comprises graphene, graphite or microcrystalline carbon, then the thickness of the carbon material of the resistivity switching storage element may be in the range of about 2 to about 100 Å, for example. The resistivity switching storage element 26 may be formed by any appropriate method, such as by thermal deposition or plasma assisted deposition (e.g., thermal chemical vapor deposition (CVD) or PECVD). Preferably, the deposition temperature is below about 600° C.

Each cell 20 preferably comprises a vertical pillar located between the electrodes 28, 30. The pillar may have a substantially cylindrical shape with a circular or roughly circular cross section having a diameter of 250 nm or less. Other pillar shapes may also be used.

Figure 4:
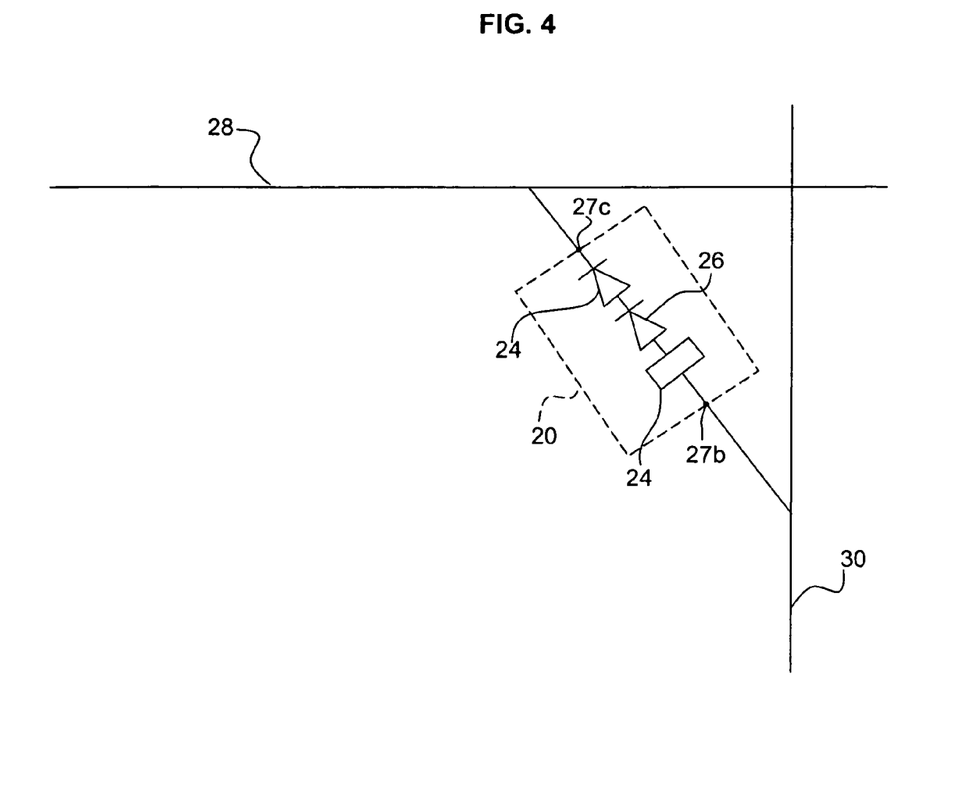
FIG. 4 is a schematic of a memory unit cell having a resistivity switching storage element arranged on one side of both of the steering elements according to an embodiment of the invention.

FIG. 4 illustrates another embodiment of the invention. The embodiment illustrated in FIG. 4 is similar to that illustrated in FIG. 2A, but the embodiment shown in FIG. 4 has the resistivity switching storage element 26 arranged on one side of (e.g., above or below) both of the steering elements 24 instead of between the steering elements 24 as in FIG. 2A.

Figure 5:
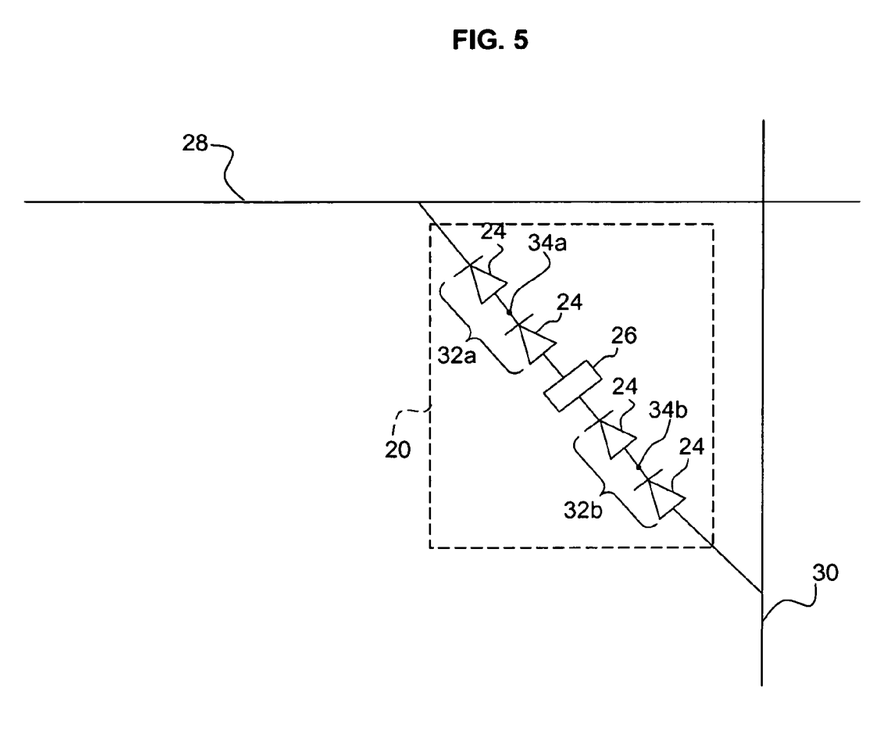
FIG. 5 is a schematic of a memory unit cell having four steering elements, where a resistivity switching storage element is arranged between pairs of the steering elements according to an embodiment of the invention.

FIG. 5 illustrates another embodiment of the invention with a memory cell 20 having four steering elements 24. The four steering elements 24 are arranged as a first pair 32a of steering elements and a second pair 32b of steering elements. In FIG. 5, the resistivity switching storage element 26 is arranged between the first pair 32a of steering elements and the second pair 32b of steering elements. The cell 20 may also include a first conductor element 34a arranged between the steering elements 24 of the first pair 32a and a second conductor element 34b arranged between the steering elements 24 of the second pair 32b. The conductor element could be TiN, for example.

The four steering elements 24 in series provide an even higher threshold voltage for the cell 20 as compared to the two steering element embodiment. Thus, a desired threshold voltage can be achieved in general by disposing an appropriate number of steering elements in series, with a larger number of steering elements providing a higher threshold voltage.

Figure 6:
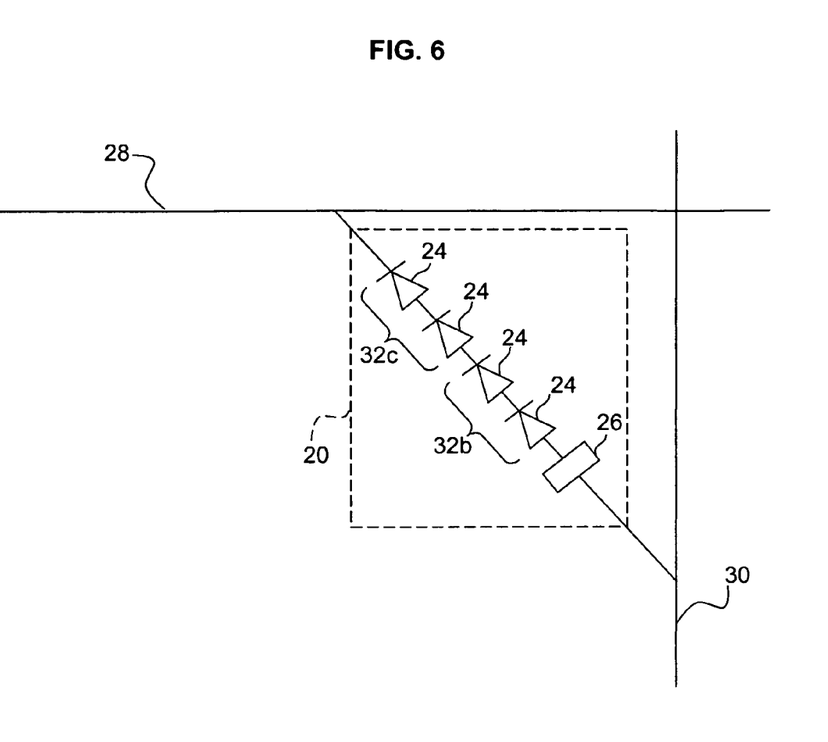
FIG. 6 is a schematic of a memory unit cell having four steering elements, where a resistivity switching storage element is arranged on one side of all four of the steering elements according to an embodiment of the invention.

FIG. 6 illustrates another embodiment of the invention with a memory cell 20 having four steering elements 24. The FIG. 6 embodiment is similar to the FIG. 5 embodiment, except that in FIG. 6, the resistivity switching storage element 26 is arranged on one side of both the first pair 32a of steering elements and the second pair 32b of steering elements, i.e., on one side of all four of the steering elements 24.

Figure 7A:
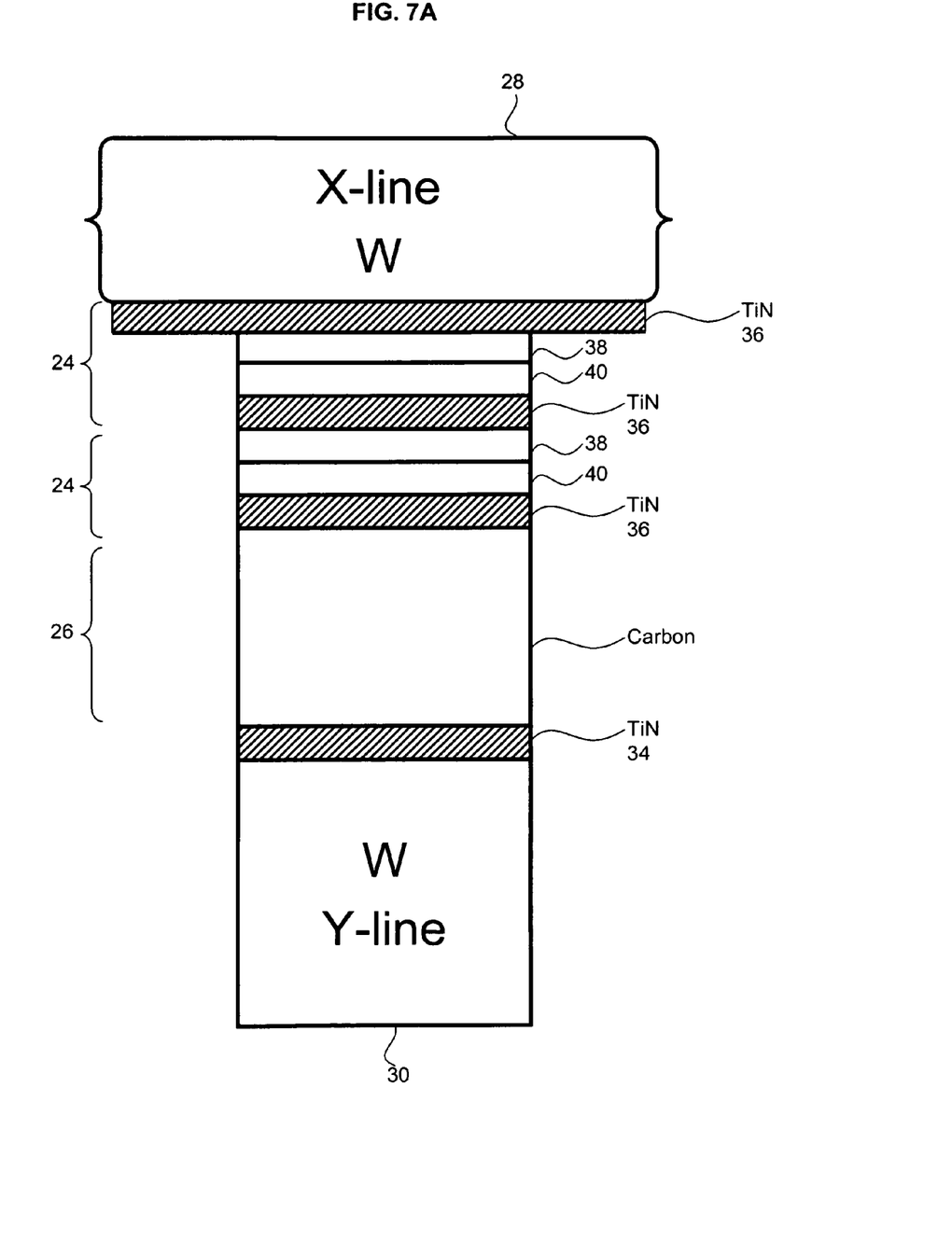
FIGS. 7A and 7B are side cross-sectional views of a memory unit cell of the cell of FIG. 4.
Figure 7B:
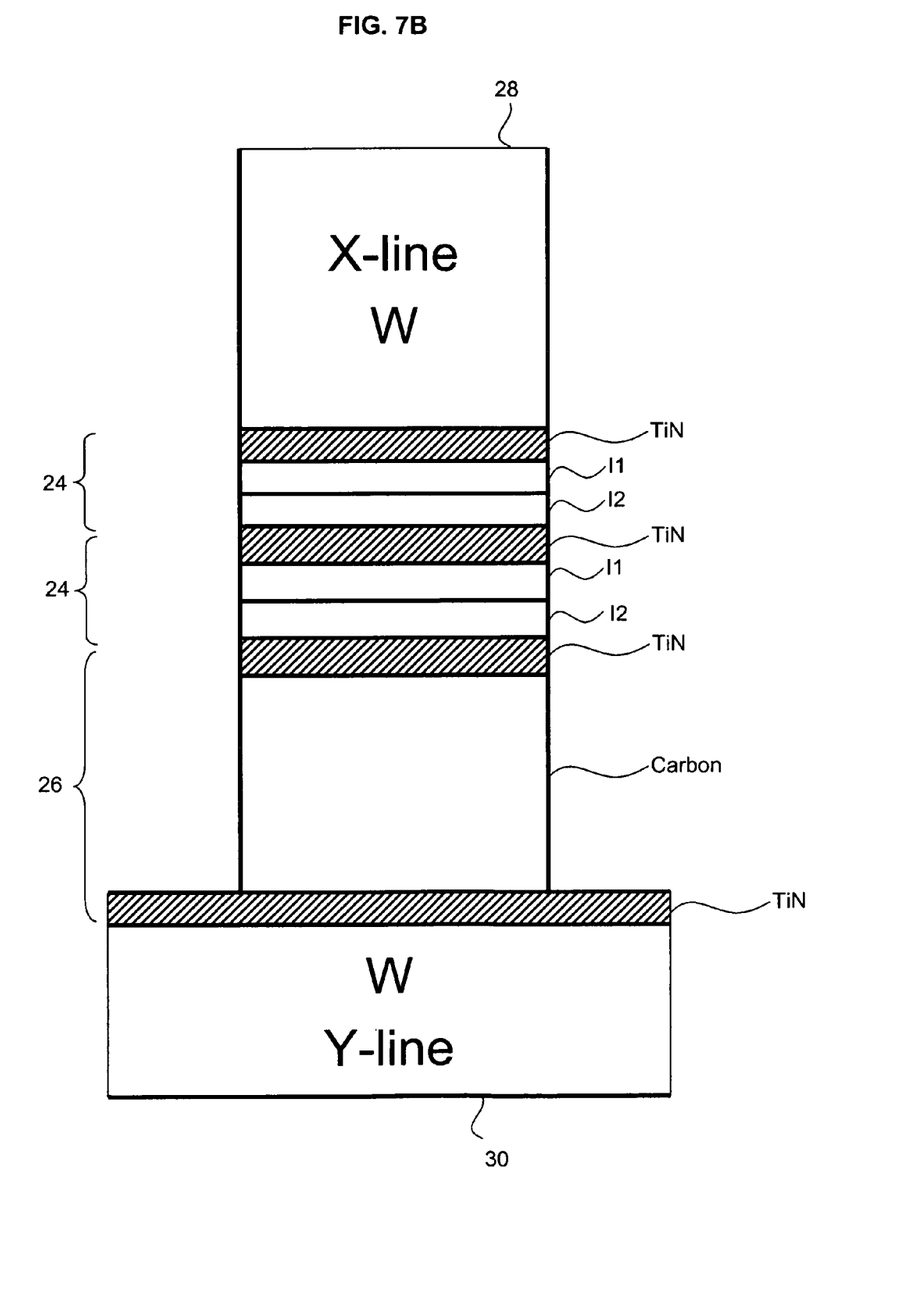

FIGS. 7A and 7B are views illustrating an embodiment with details of the materials used for forming the cell of FIG. 4. As shown in FIGS. 7A and 7B, the bit line 28 (X-line) and word line 30 (Y-line) comprise a metal, such as tungsten, copper or aluminum, for example. The resistivity switching storage element 26 is a carbon based material, such as microcrystalline carbon, graphene or graphite, for example. An optional TiN layer 34 is disposed between the carbon based material 26 and the word line 30. The steering elements 24 are arranged to both be on the same side of the resistivity switching storage element 26.

The steering elements 24 each comprise a MIIM diode, where the MIIM diode comprises layers 36, 38, 40 and 36, in order from the top. The metal or conductor layers 36 may comprise TiN, while the insulator layers 38 and 40 may comprise two different layers selected from suitable insulating materials, such as silicon oxide, aluminum oxide, hafnium oxide, lanthanum oxide and tantalum oxide.

The embodiments described above have two or four steering elements 24. In general, the steering elements for a particular memory cell may be two or more, and may be an odd number.

Formation of a first memory level has been described with respect to FIG. 3. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The three-dimensional array of cells in a preferred embodiment comprises a word line arrangement having multi-layer word line segments for three-dimensional memory arrays as described in more detail in U.S. Pat. No. 7,106,652 hereby incorporated in its entirety for all purposes.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory array, comprising:
    a plurality of nonvolatile memory cells, wherein each of the plurality of memory cells comprises at least two two-terminal non-linear steering elements arranged in series and a resistivity switching storage element arranged in series with the at least two two-terminal non-linear steering elements;
    a plurality of word lines; and
    a plurality of bit lines,
    wherein the plurality of nonvolatile memory cells, word lines and bit lines are arranged to comprise a monolithic three dimensional memory array.

2. The memory array of claim 1, wherein each nonvolatile memory cell comprises:
    a first terminal connected to one of the plurality of bit lines;
    a second terminal connected to one of the plurality of word lines; and
    the resistivity switching storage element and the at least two two-terminal non-linear steering elements are arranged in series between the first terminal and the second terminal.

3. The memory array of claim 1, wherein each of the at least two two-terminal nonlinear switching elements comprises a diode.

4. The memory array of claim 3, wherein each diode comprises a semiconductor p-n diode or a semiconductor p-i-n diode.

5. The memory array of claim 3, wherein each diode comprises a metal-insulator-metal (MIM) diode or a metal-insulator-insulator-metal (MIIM) diode.

6. The memory array of claim 1, wherein the resistivity switching storage element is selected from at least one of antifuse, fuse, polysilicon memory effect element, metal oxide or switchable complex metal oxide element, carbon based element, phase change material element, conductive bridge element, or switchable polymer element.

7. The memory array of claim 6, wherein the resistivity switching storage element comprises the carbon based element.

8. The memory array of claim 7, wherein the carbon based element is selected from carbon nanotube, amorphous carbon, microcrystalline carbon, graphite or graphene resistivity switching material.

9. The memory array of claim 8, wherein the resistivity switching storage element has a thickness in a range of about 2 to about 10 Å.

10. The memory array of claim 1, wherein the at least two non-linear steering elements comprise two non-linear steering elements.

11. The memory array of claim 10, wherein the resistivity switching storage element is arranged between the two non-linear steering elements.

12. The memory array of claim 10, wherein the resistivity switching storage element is arranged on one side of both of the two non-linear steering elements.

13. The memory array of claim 1, wherein the at least two non-linear steering elements comprise four non-linear steering elements arranged in series.

14. The memory array of claim 13, wherein:
the four non-linear steering elements comprise a first pair of non-linear steering elements and a second pair of non-linear steering elements; and
the resistivity switching storage element is arranged between the first pair and the second pair of non-linear steering elements.

15. The memory array of claim 13, wherein the resistivity switching storage element is arranged on one side of the four non-linear steering elements.

16. The memory array of claim 13, wherein:
the four non-linear steering elements comprise a first pair of non-linear steering elements and a second pair of non-linear steering elements;
a first conductor element is arranged between the non-linear steering elements of the first pair; and
a second conductor element is arranged between the non-linear steering elements of the second pair.

17. The memory cell of claim 1, wherein the at least two two-terminal non-linear steering elements and the resistivity switching storage element are arranged vertically between a lower electrode and an upper electrode.

18. A memory array, comprising:
a plurality of nonvolatile memory cells, wherein each of the plurality of memory cells comprises two two-terminal non-linear steering elements arranged in series and a resistivity switching storage element arranged between or on one side of both of the two non-linear switching storage elements;
a plurality of word lines; and
a plurality of bit lines.

19. The memory array of claim 18, wherein the resistivity switching storage element is arranged between the two non-linear steering elements.

20. The memory array of claim 18, wherein the resistivity switching storage element is arranged on one side of both of the two non-linear steering elements.

21. The memory array of claim 18, wherein each nonvolatile memory cell comprises:
a first terminal connected to one of the plurality of bit lines;
a second terminal connected to one of the plurality of word lines; and
the resistivity switching storage element and the two two-terminal non-linear steering elements are arranged in series between the first terminal and the second terminal.

22. The memory array of claim 18, wherein each of the two two-terminal nonlinear switching elements comprises a diode and wherein the resistivity switching storage element is selected from at least one of antifuse, fuse, polysilicon memory effect element, metal oxide or switchable complex metal oxide element, carbon based element, phase change material element, conductive bridge element, or switchable polymer element.

23. A memory array, comprising:
a plurality of nonvolatile memory cells, wherein each of the plurality of memory cells comprises four two terminal non-linear steering elements arranged in series and a resistivity switching storage element in series with the four two terminal non-linear steering elements;
a plurality of word lines; and
a plurality of bit lines.

24. The memory array of claim 23, wherein:
the four non-linear steering elements comprise a first pair of non-linear steering elements and a second pair of non-linear steering elements; and
the resistivity switching storage element is arranged between the first pair and the second pair of non-linear steering elements.

25. The memory array of claim 23, wherein the resistivity switching storage element is arranged on one side of the four non-linear steering elements.

26. The memory array of claim 23, wherein:
the four non-linear steering elements comprise a first pair of non-linear steering elements and a second pair of non-linear steering elements;
a first conductor element is arranged between the non-linear steering elements of the first pair; and
a second conductor element is arranged between the non-linear steering elements of the second pair.

27. The memory array of claim 23, wherein each nonvolatile memory cell comprises:
a first terminal connected to one of the plurality of bit lines;
a second terminal connected to one of the plurality of word lines; and
the resistivity switching storage element and the four two-terminal non-linear steering elements are arranged in series between the first terminal and the second terminal.

28. The memory array of claim 23, wherein each of the four two-terminal nonlinear switching elements comprises a diode and wherein the resistivity switching storage element is selected from at least one of antifuse, fuse, polysilicon memory effect element, metal oxide or switchable complex metal oxide element, carbon based element, phase change material element, conductive bridge element, or switchable polymer element.

* * * * *